(12) United States Patent
Hsu et al.

(10) Patent No.: US 6,774,004 B1
(45) Date of Patent: Aug. 10, 2004

(54) NANO-SCALE RESISTANCE CROSS-POINT MEMORY ARRAY

(75) Inventors: Sheng Teng Hsu, Camas, WA (US); Wei-Wei Zhuang, Vancouver, WA (US); Wei Pan, Vancouver, WA (US); Fengyan Zhang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/391,357

(22) Filed: Mar. 17, 2003

(51) Int. Cl.[7] .............. H01L 21/20; H01L 21/8238; H01L 21/00
(52) U.S. Cl. ............. 438/382; 438/3; 438/210; 438/238; 438/381
(58) Field of Search ................ 438/382, 381, 438/238, 210, 237, 3

(56) References Cited

U.S. PATENT DOCUMENTS

| | | | |
|---|---|---|---|
| 5,477,482 A | * 12/1995 | Prinz ........................... | 365/129 |
| 6,440,752 B1 | * 8/2002 | Zhang et al. .................. | 438/3 |
| 6,507,466 B1 | * 1/2003 | Hayashi et al. ............. | 360/323 |
| 6,521,931 B2 | * 2/2003 | Sandhu et al. .............. | 257/295 |
| 6,569,745 B2 | * 5/2003 | Hsu ........................... | 438/238 |
| 2001/0035545 A1 | * 11/2001 | Schuster-Wiodan et al. ..... | 257/296 |

OTHER PUBLICATIONS

Liu et al., *Electric–pilse–induced reversible resistance change effect in magnetoresistive films*, Applied Physics Letters, vol. 76, No. 19, pp 2749–2751 (May 2000).

* cited by examiner

Primary Examiner—Michael Trinh
(74) Attorney, Agent, or Firm—David C. Ripma; Matthew D. Rabdau (57) ABSTRACT

A method of fabricating a nano-scale resistance cross-point memory array includes preparing a silicon substrate; depositing silicon oxide on the substrate to a predetermined thickness; forming a nano-scale trench in the silicon oxide; depositing a first connection line in the trench; depositing a memory resistor layer in the trench on the first connection line; depositing a second connection line in the trench on the memory resistor layer; and completing the memory array. A cross-point memory array includes a silicon substrate; a first connection line formed on the substrate; a colossal magnetoresistive layer formed on the first connection line; a silicon nitride layer formed on a portion of the colossal magnetoresistive layer; and a second connection line formed adjacent the silicon nitride layer and on the colossal magnetoresistive layer.

15 Claims, 7 Drawing Sheets

NANO-SCALE RESISTANCE CROSS-POINT MEMORY ARRAY

RELATED APPLICATIONS

This Application is related to Ser. No. 09/940,312, filed Aug. 27, 2001, for Nano-Memory Device and Method of Making the Same; Ser. No. 09/894,922, filed Jun. 28, 2001, now U.S. Pat. No. 6,531,371 granted Jul. 1, 2003 for Electrical Programmable Resitance Cross Point Memory; and Ser. No. 09/893,830, filed Jun. 28, 2001, for Low Cross-talk Electrically Programmable Resistance Cross Point Memory.

FIELD OF THE INVENTION

This invention relates to high density non-volatile memory, and specifically to a cross-point memory array incorporating ferroelectric, colossal magnetoresistive-based resistors, and a ferroelectric, colossal magnetoresistive-based resistors having a p/n junction therein.

BACKGROUND OF THE INVENTION

An ongoing goal of IC designers is the provision of a memory cell having a very small size, low power and current programming requirements, and long charge retention. A number of IC memory devices are known. A flash memory requires one transistor per memory cell and also requires high programing voltages. This type of non-volatile memory is not suitable for low-power, high-speed application. A ferroelectric-based RAM also requires a single transistor per memory cell, however, known FeRAMs have a relatively short charge retention time, on the order of nano-seconds. There are also problems associated with nano-scale structures when it is required to apply photoresist and to etch the structure. A MRAM requires high current to program data into the memory cell.

Fabrication of nano-scale ($10^{-9}$ meters) ICs is limited by the resolution of the lithography portion of the fabrication process, which is approximately 0.1 $\mu$m ($10^{-7}$ meters). E-beam lithography may able to define line width as narrow as 0.01 $\mu$m ($10^{-8}$ meters), however, the through put is very slow. A manufacturing process having the reliability and throughput of conventional lithography and etching with nearly the resolution of E-beam lithography is therefore desirable.

Liu et al. Electrical-pulse-induced reversible resistance change effect in magnetoresistive films, Applied Physics Letters, Vol.76, #19, p.2749, May, 2000, describes use of colossal magnetoresistive (CMR) films in memory devices.

SUMMARY OF THE INVENTION

A method of fabricating a nano-scale resistance cross-point memory array includes preparing a silicon substrate; depositing silicon oxide on the substrate to a predetermined thickness; forming a nano-scale trench in the silicon oxide; depositing a first connection line in the trench; depositing a memory resistor layer in the trench on the first connection line; depositing a second connection line in the trench on the memory resistor layer, and completing the memory array.

A cross-point memory array includes a silicon substrate; a first connection line formed on the substrate; a colossal magnetoresistive layer formed on the first connection line; a silicon nitride layer formed on a portion of the colossal magnetoresistive layer; and a second connection line formed adjacent the silicon nitride layer and on the colossal magnetoresistive layer.

It is an object of the invention to provide a nano-scale non-volatile memory array for ultra-high density low power consumption memory array.

Another object of the invention is to provide a method of fabricating a nano-scale non-volatile memory array for ultra-high density low power consumption memory array.

Another object of the invention is to provide a memory cell of size $1F^2$, where F is the minimum feature size of lithographic resolution.

A object of the invention is to provide a memory cell having a 0.1 $\mu$m node is a cell area of 0.01 $\mu m^2$.

A further object of the invention is provide a memory array having a P+N diode at every memory cell to prevent read interference.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The front end of the wafer process, i.e., preparing the substrate, including well formation, device isolation, threshold voltage adjustment, gate formation, source/drain ion implantation, and oxide passivation may be fabricated using any state-of-the-art process.

Figure 1:
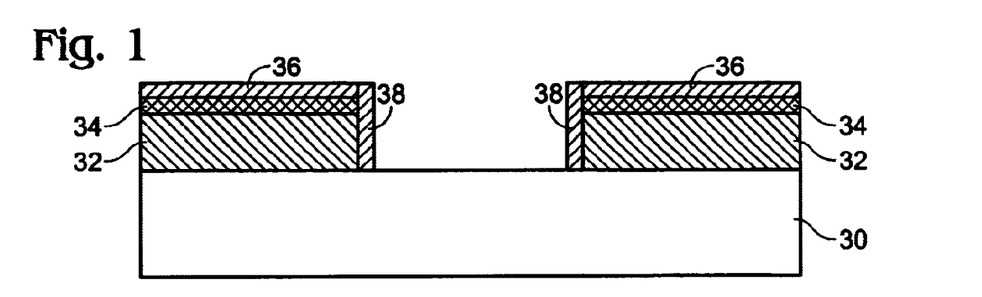
FIGS. 1–10 depict steps in the fabrication of a first and second embodiment of a memory array constructed according to the method of the invention.

After the front end process is complete, and all active device areas have been fabricated, and after part of the wiring interconnects have been laid down, the cross-point memory element of the invention and method of the invention is built. Referring to FIG. 1, a silicon substrate 30 has a first layer of silicon oxide 32 deposited thereon to a thickness of between about 200 nm to 400 nm. A first layer of a metal 34, such as TiN, is deposited to a thickness of between about 50 nm to 200 nm, and first layer of silicon nitride 36, forming a SiN cap, is deposited to a thickness of between about 20 nm to 100 nm. The structure is covered with photo-resist, and the SiN, TiN, and oxide layers are etched. A second layer 38 of SiN is deposited to a thickness of between about 10 nm to 100 nm. This layer is etched to form a nitride spacer, being careful to not over etch, which may result in the removal of a portion of the first SiO₂ layer 36. It will be understood by one of ordinary skill in the art that FIGS. 1 through 5 are cross-sectional views in the "X" direction.

Figure 2:
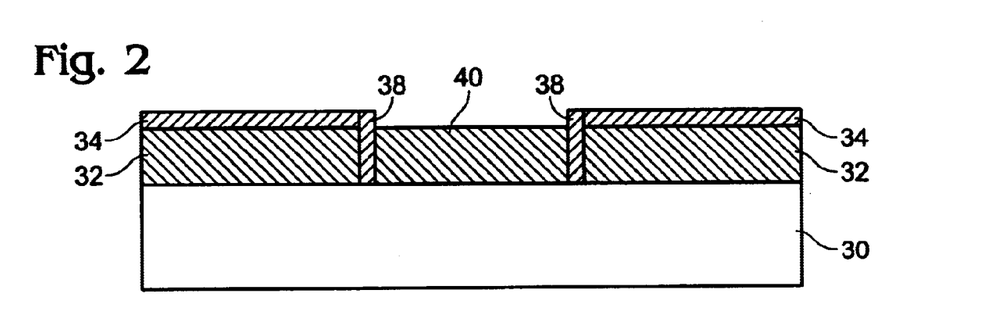

A second oxide layer 40 is deposited, as shown in FIG. 2, having a thickness which is at least 1.3× of the thickness of first oxide layer 32. The oxide layers of the structure are chemical mechanical polished (CMPed), with the polishing process stopping at the level of first SiN layer 36. The oxide layers are selectively etched, removing oxide equivalent to the sum of the thicknesses of first TiN layer 34 and first SiN layer 36, which is between about 70 nm to 300 nm.

Figure 3:
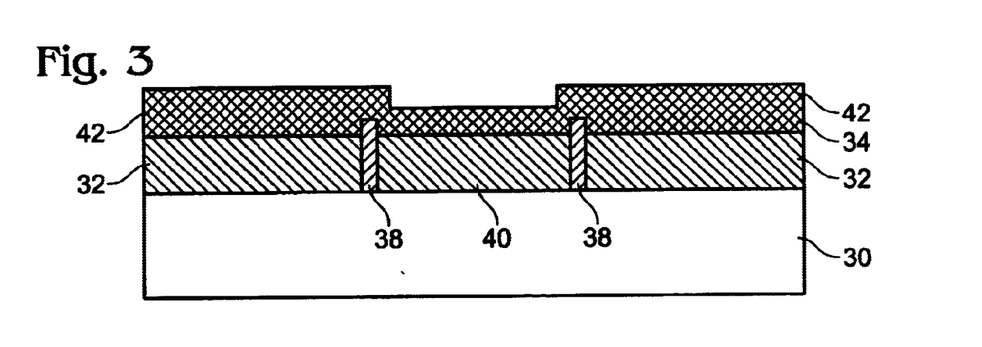

Referring to FIG. 3, a second metal layer 42, e.g., TiN, is deposited to a thickness of between about 70 nm to 300 nm, e.g. the combined thickness of first TiN layer 34 and first SiN layer 36.

Figure 4:
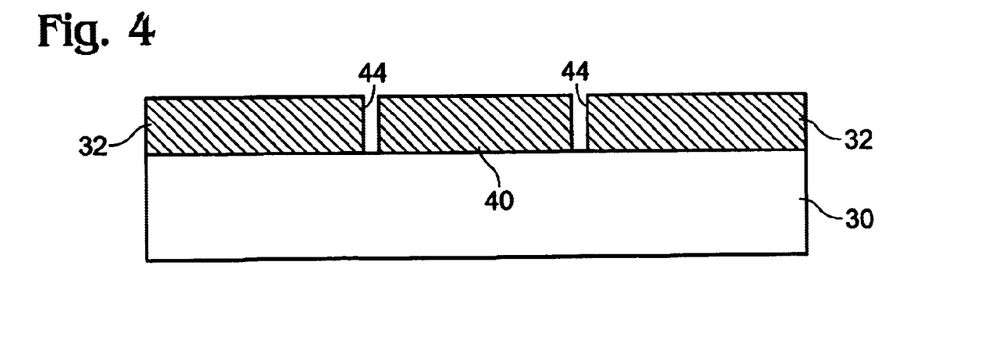

FIG. 4 depicts the structure following CMP of the TiN layers to expose second SiN, layer 38, which may be completely removed in some embodiments of the method of the invention, resulting in nano-scale trenches 44, which have a width of between about 10 nm to 100 nm. Photoresist is applied to mask the field region, e.g., the region outside of the memory array region. The nitride layer of the structure is wet etched.

Figure 5:
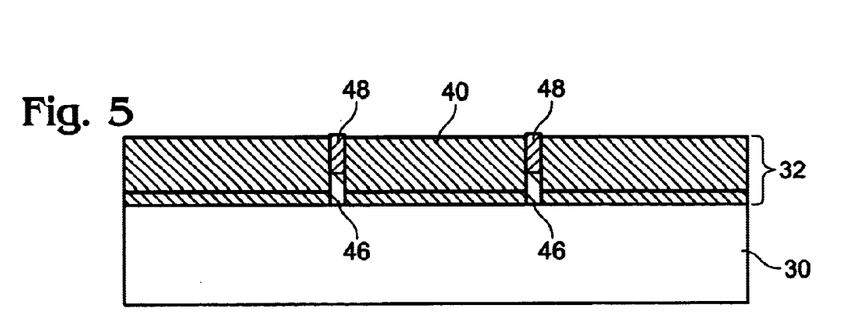
Figure 6:
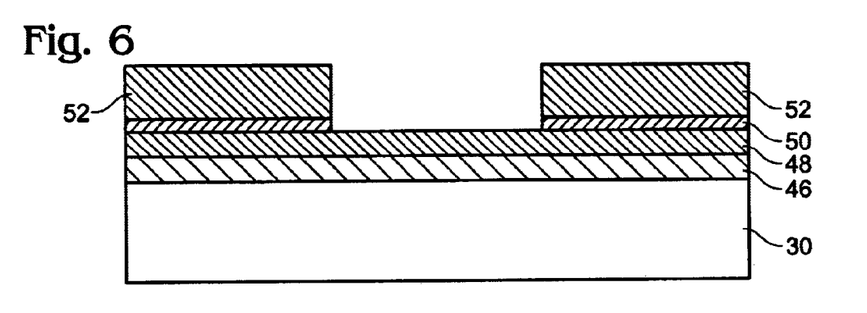

Referring now to FIG. 5, a bottom electrode 46 is deposited. Bottom electrode 46 may be formed of $Y_xBa_2Cu_3O_{7-x}$ (YBCO), Pt or Ir, and forms a first connection line, which in this embodiment is a "word" line of the memory array. The thickness of the bottom electrode is at least equal to half of the trench depth. An optional CMP step may be used to remove bottom electrode material from the top of TiN to provide a bottom electrode thickness of between 200 nm to 400 nm. The structure is plasma etched, e.g., using Ar, $O_2$, and $Cl_2$ chemistry, to remove between about 200 nm to 300 nm of the bottom electrode in trenches 44, as well as the TiN layer. The remaining trench depth will be the thickness of the cross-point memory resistor thickness, which will be about 200 nm. A memory resistance layer of CMR material 48, such as $Pr_{0.7}Ca_{0.3}MnO_3$, (PCMO), or other colossal magnetoresistive memory resistance material, is deposited to a thickness of at least equal to one half that of the thickness of second SiN layer 38. The portion of PCMO layer on the field region is removed by CMP, resulting in the she depicted in FIG. 5.

FIGS. 6 through 9 depict the structure as a cross-section view take in the y-direction at any given word line. Between about 10 nm to 20 nm of a third silicon nitride layer 50 is deposited as an etch stop. Between about 200 nm to 400 nm of a third oxide layer 52 is also deposited. Photoresist is applied, and the third oxide and third nitride layers etched prior to formation of top electrode "bit" lines.

Figure 7:
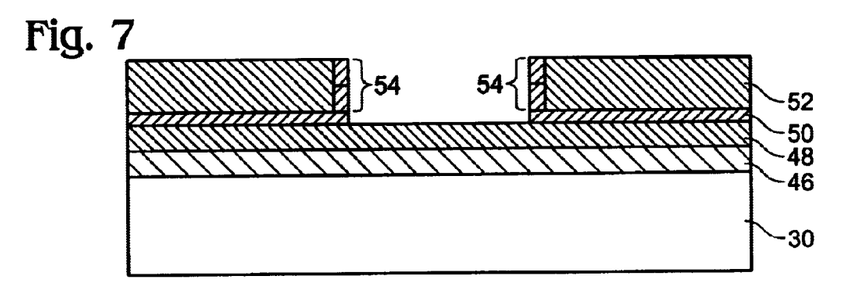

Referring to FIG. 7, a fourth SiN layer 54 is deposited to a thickness of between about 10 nm to 100 nm. The forth SiN layer is plasma etched to form a SiN sidewall.

Figure 8:
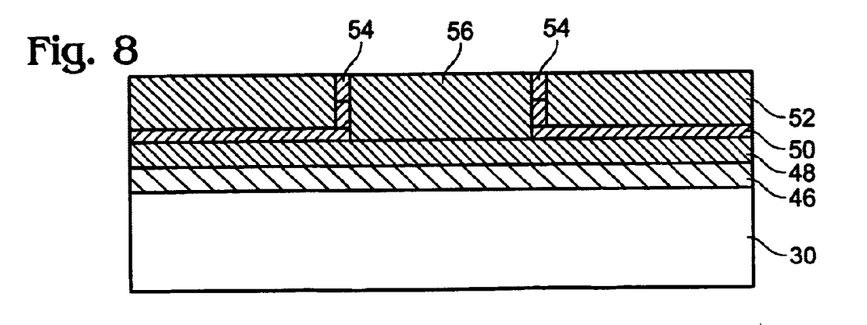

FIG. 8 depicts the deposition of a fourth oxide layer 56 to a thickness at least equal to 1.3× of that of the third oxide layer. The structure is CMPed, stopping at the level of the third SiN layer. Photoresist is applied to mask the field region, e.g., outside of the memory array region, and the SiN layer etched. Top electrode material 58 is deposited to form a second connection line, which, in this embodiment is the array bit line. The top electrode material may be any of Al, Cu, Pt, Ir, or Au. The top electrode thickness is at least equal to one half of the third SiN layer thickness.

Figure 9:
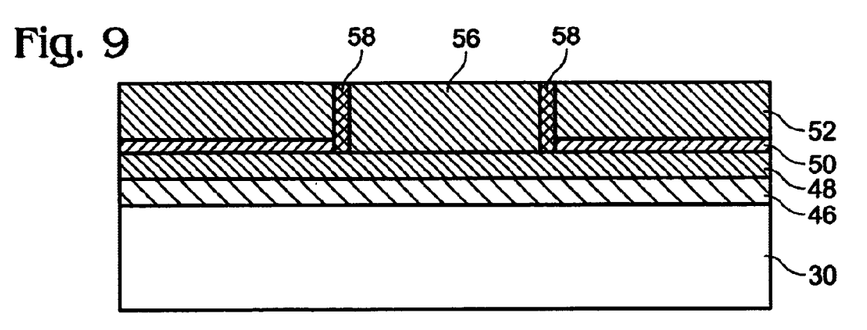
Figure 10:
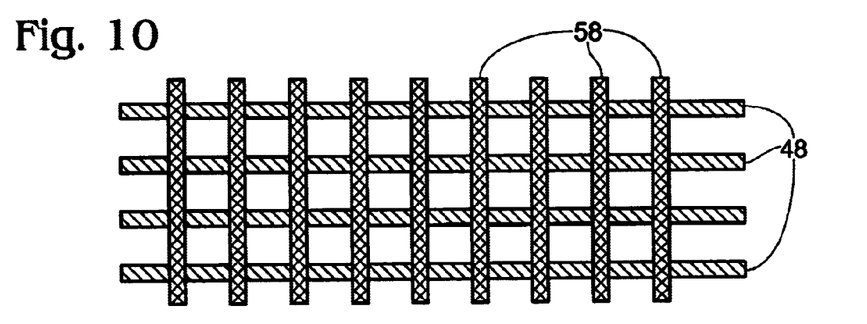

Referring to FIG. 9, the top electrode is CMPed, resulting in the memory array as depicted in the figure. A top view of the memory array is presented as FIG. 10.

The first embodiment of the method of the invention uses TiN as a hard mask during etching of the memory resistor, such as PCMO. The other materials, such as SiN, TaN, WN, etc., may also be used as hard mask.

If a hard mask is not required the process is much simpler, and comprises the second embodiment of the method of the invention. There is no need for first TiN layer 34, first SiN layer 36 nor second TiN layer 42, thus, thee is no need for selective etching of oxide to the level of first TiN layer 34 and first SiN layer 36.

The width of the word lines and bit lines can be narrower than 10 nm. Four bits are formed in each minimum size lithographic line pitch. Therefore the average memory is equal to $1F^2$, where F is the resolution width of the lithographic tool, e.g., for a 1 μm node there is one bit in each 1 $\mu m^2$ of array area. For a 0.1 μm node, 25 bits of memory cells may be fabricated in a memory array area of approximately 1 $\mu m^2$, e.g., each bit line requires a space of about 0.1 μm, and a space of about 0.1 μm must be located between each, bit line, thus a line+a space requires about 0.2 μm of surface Five bit lines and their associated spaces may be formed in a node of about 1 μm. An equal number of perpendicular lines are formed in the same space, therefore, 25 bits may be fabricated in an area of about 1 $\mu m^2$.

The memory array is completed by the addition of any other required structures and metallization of the array.

Figure 19:
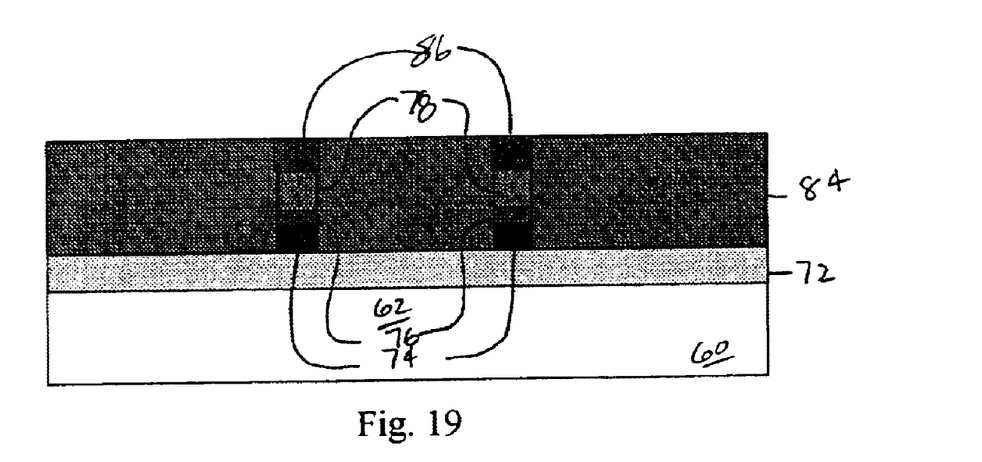
Figure 20:
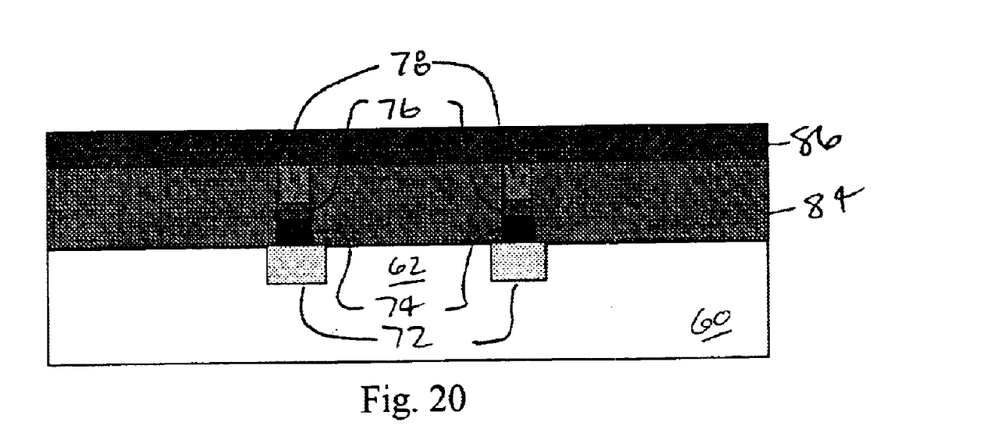

In the third embodiment of the method of the invention, a P+N diode is added to each memory cell in a memory array to prevent read interference to the addressed memory bit. The cross-section of the final memory structure is shown in FIG. 19 and FIG. 20. FIG. 19 is the cross-sectional view of the memory array of the invention along the bottom electrode, which is referred to herein as the bit line direction. FIG. 20 is the cross-section view of the memory array of the invention along the top electrode line, which is referred to herein as the word line direction. The fabrication process is similar to that of the first-above-identified related application, with the inclusion of two ion implantation steps and a diffusion step.

The front end of the wafer process, that is substrate preparation, including well formation, device isolation, threshold voltage adjustment, gate formation, source/drain ion implantation, and oxide passivation may be performed using any state-of-the-art process, as in the first embodiment of the method of the invention.

After the front-end process is completed, where all of the active devices may have been fabricated and part wiring may also been completed, the fabrication of cross point memory element is started as follows: FIGS. 11 through 14 are cross-section views in the word line direction.

Figure 11:
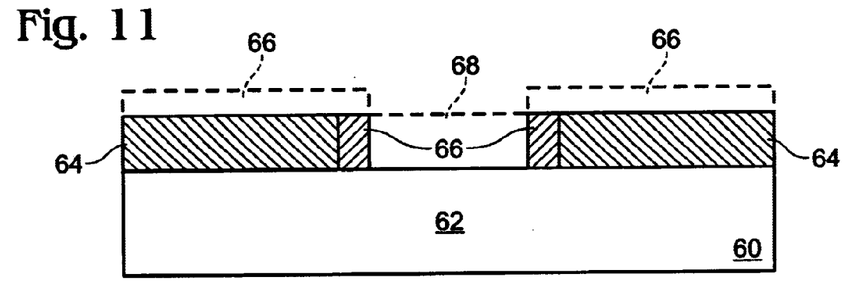
FIGS. 11–20 depicts steps in the fabrication of an IC device according to a third embodiment of the method of the invention.
Figure 12:
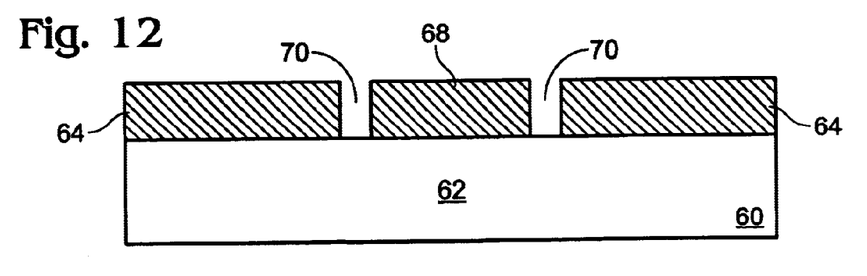

Referring now to FIG. 11, a silicon substrate 60 has a p-well 62 formed therein. The p-well doping density is in the order of $5 \times 10^{17} cm^{-2}$ to $1 \times 10^{19} cm^{-2}$, and may be fabricated at the same time as the p-wells for n-channel active transistors. A first silicon oxide layer 64 is deposited to a thickness of between about 200 nm to 400 nm. Photoresist is applied, and the first oxide layer etched to form trenches for the formation of two bit lines on each trench. A first silicon nitride layer 66 is deposited to a thickness of between about 10 nm to 100 nm. Nitride layer 66 is etched to form a nitride spacer at the sidewall of the oxide layer. A second oxide layer 68 is deposited to a thickness of at least 1.3× that of the thickness of the first oxide layer. The oxide-layers are CMPed, stopping at the level of first SiN layer 66. Referring to FIG. 12, the SiN is selectively etched to form nano-scale trenches 70.

Figure 13:
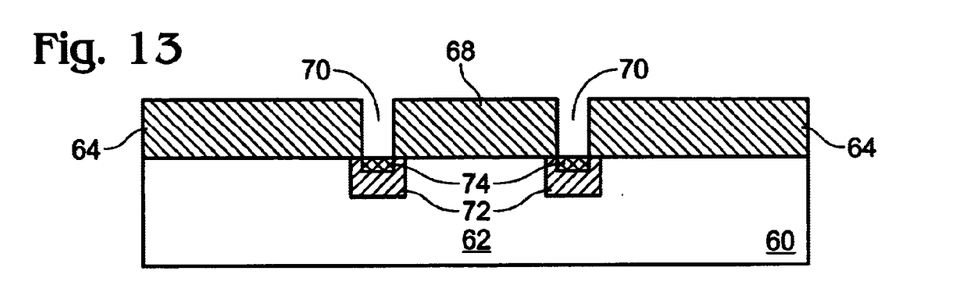

As shown in FIG. 13, phosphorus ion implantation is performed at an energy of between about 30 keV to 80 keV and at a dose of between about $1 \times 10^{14} cm^{-2}$ to $1 \times 10^{15} cm^{-2}$. The n+layer 72 is diffused to between about 20% to 30% of the space between the nano-scale trenches, at a temperature range of between about 850° C. to 1000° C. for between about 10 to 30 minutes. These n-layers become the "bit" lines, also referred to herein as connection lines. The bottom electrode may serve as either a bit line or a word line, while the soon-to-be-form top electrode serves as the other of the two lines. A photoresist mask is fabricated to protect the bottom electrode contact area outside of the memory array during the next ion implantation step. Boron or $BF_2$ ion implantation is performed at an energy of between about 5 keV to 10 keV for boron ions and between about 20 keV to 50 keV for $BF_2$ ions to form a p+layer 74. The dose for both ion species is between about $1\times10^{15} cm^{-2}$ to $5\times10^{15} cm^{-2}$.

Figure 14:
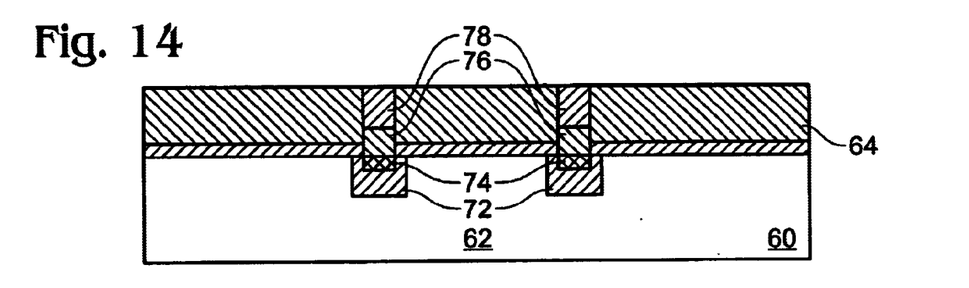
Figure 15:
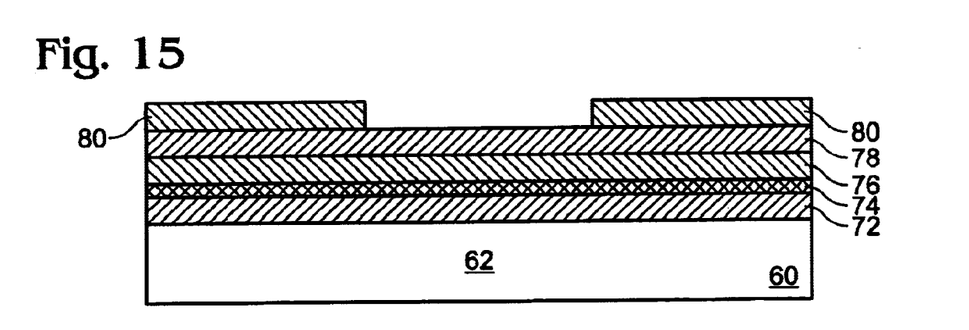

Referring now to FIG. 14, plasma etch removes any oxide on the surface of the p+silicon surface 74. A bottom electrode 76 is deposited. The material for bottom electrode 76 may be selected from the materials including $Y_xBa_2Cu_3O_{7-x}$ (YBCO), Pt, or Ir. The bottom electrode initially fills trenches 70. Plasma etch, using e.g., Ar, $O_2$, and $Cl_2$ chemistry, partially removes the bottom electrode to a thickness of between about 50 nm to 100 nm. A memory resistance layer 78, such as $Pr_{0.7}Ca_{0.3}MnO_3$ (PCMO), or other suitable CMR material, is deposited to a thickness of at least the thickness of first nitride layer 66. The PCMO on the field area is removed by CMP.

FIGS. 15 through 20 are cross-section views in the bit line direction at any given word line. A third oxide layer 80 is deposited to a thickness of between about 100 nm to 200 nm. Photoresist is applied, and the oxide etched to form trenches for the top electrode, to be used as "word" lines. A second SiN layer 82 is deposited to a thickness of between about 10 nm to 100 nm.

Figure 16:
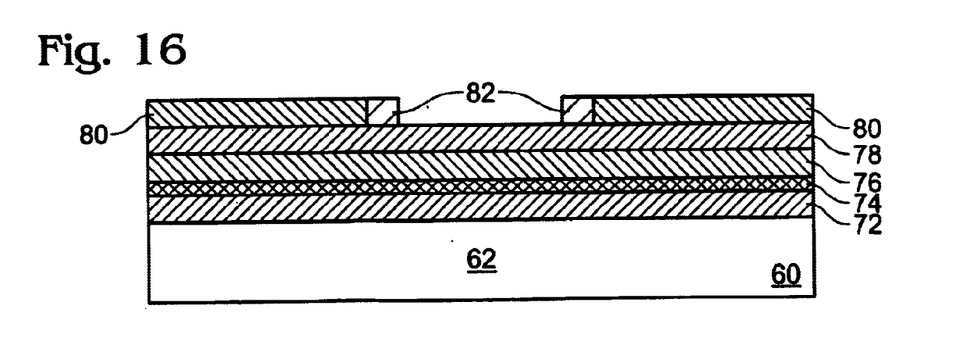
Figure 17:
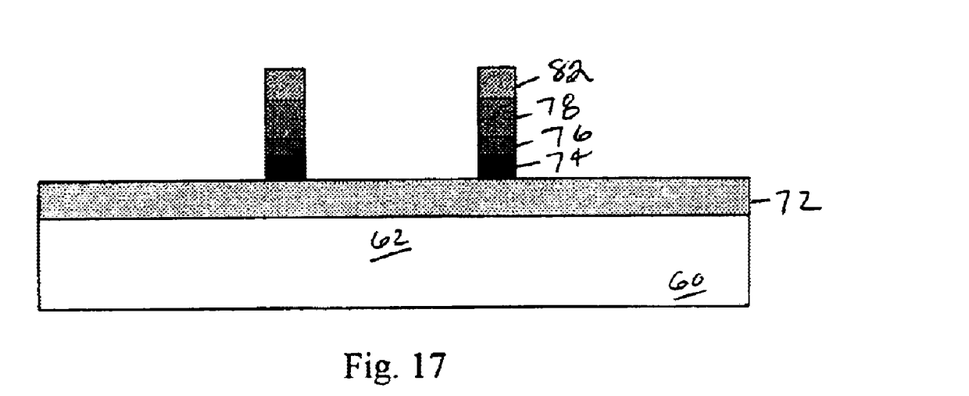

Referring to FIG. 16, second SiN layer 82 is plasma etched to form a SiN sidewall. The third oxide layer is also plasma etched, along with the PCMO layer, the bottom electrode and the P+implanted silicon, producing the structure depicted in FIG. 17. A fourth oxide layer 84 is deposited to a thickness of at least 1.3× of that of sum of the first and the third oxide layers.

Figure 18:
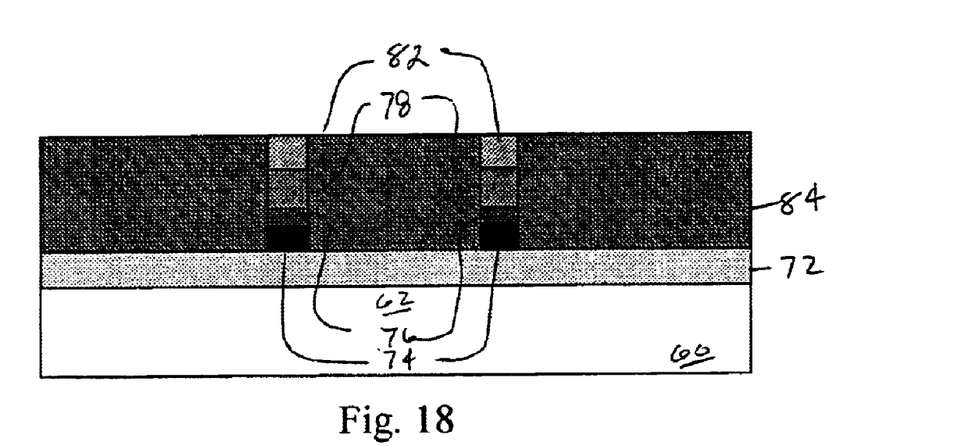

The fourth oxide layer is smoothed by CMP, stopping at the underlying SiN layer, as shown in FIG. 18. The SiN layer is selectively etched, leaving a trench for the top electrode. A top electrode 86 is deposited as a "word" line, or other connection line. The top electrode may be selected from the materials including Al, Cu, Pt, Ir, or Au. The top electrode thickness is at least equal to one half of the third nitride thickness.

The top electrode is smoothed by CMP. The final memory array is depicted in FIG. 19, with a cross-section of the memory array of FIG. 19 taken along the word line depicted in FIG. 20.

As in the first embodiment, the N-diffusion lines are the bottom electrodes of the memory cells. The width of the word lines and bit lines may be narrower than 10 nm. Four bits are formed in each minimum size lithographic line pitch. Therefore the average memory bit area is equal to $1F^2$, where F is the resolution width of the lithographic tool.

The array shown in FIGS. 11–20 requires a lateral diffusion of the n+region to avoid p+/n/p-well punchthrough. Therefore, the doping concentration of the p+and that of the n-lines control is critical. This problem can be minimized by a selective epitaxial growth of silicon for higher density and better reliability nano-scale cross-point memory array. The process of the third embodiment of the invention may be modified by setting the thickness of the first oxide layer 62 to be between about 300 nm to 500 nm, then performing the method of the invention described in connection with FIGS. 11–20, thus comprising a fourth embodiment of the method of the invention.

Figure 21:
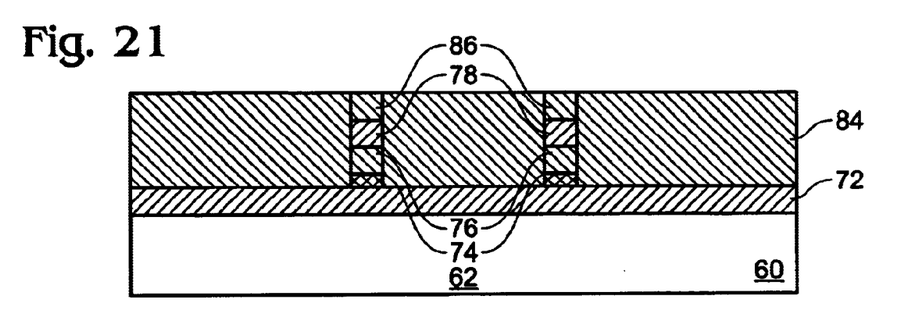
FIGS. 21–23 depict a device constructed according to a fourth and fifth embodiment of the method of the invention.
Figure 22:
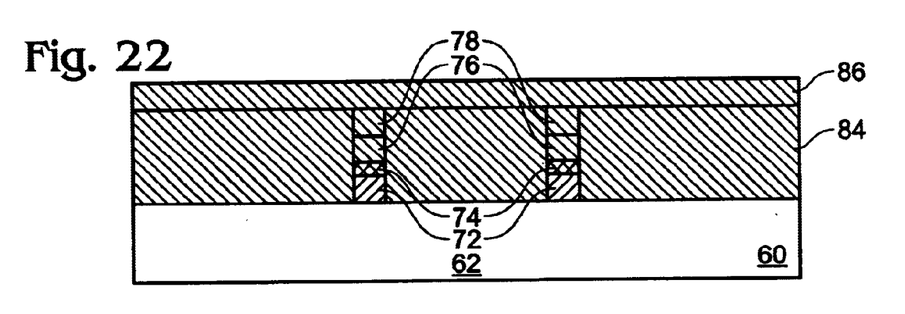

The cross-sectional view of the finished memory array is shown in FIG. 21 and FIG. 22, which depict devices constructed according to the variation of the second embodiment of the method of the invention of a cross-section view along bottom electrode and that along top electrode, respectively.

Figure 23:
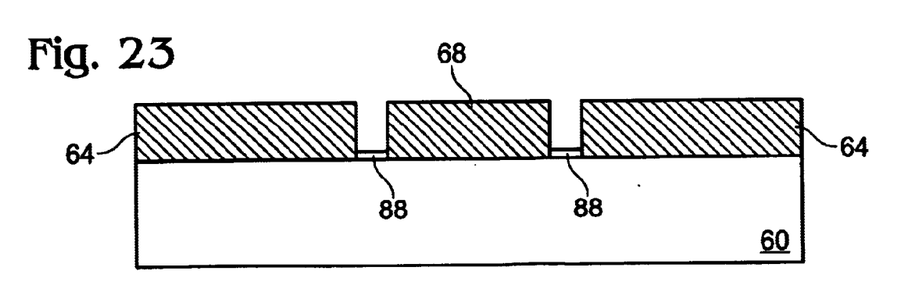

Another variation includes the inclusion of a selective epitaxial silicon growth in connection with the steps of FIG. 12, as shown in FIG. 23, wherein an epitaxial silicon layer 88, having a thickness of between about 100 nm to 300 nm is formed, followed by the steps of FIGS. 13–20, comprising a fifth embodiment of the method of the invention.

After the cross-point memory array is built, the IC is completed by fabricating any additional structures thereon, and by metallizing the device.

Thus, a nano-scale resistance cross-point memory array and a method for fabricating the array has been disclosed, as well as a resistance cross-point memory array having p/n junctions associated with each resistor. It will be appreciated that further variations and modifications thereof may be made within the scope of the invention as defined in the appended claims.

We claim:

1. A cross-point memory array comprising:

a silicon substrate;

an insulating layer formed over portions of the substrate;

a nano-scale trench formed in the insulating layer;

a silicon epitaxial layer having a thickness of between about 100 nm to 300 nm formed on the silicon substrate in the nano-scale trench;

a first connection line formed on the silicon epitaxial layer;

a colossal magnetoresistive layer formed on the first connection line;

a silicon nitride layer formed on a portion of the colossal magnetoresistive layer; and a second connection line formed adjacent the silicon nitride layer and on the colossal magnetoresistive layer.

2. The memory array of claim 1 wherein said first connection line is formed from an electrode material taken from the group of electrode materials consisting of $Y_xBa_2Cu_3O_{7-x}$, Pt and Ir.

3. The memory array of claim 1 wherein said colossal magnetoresistive layer is formed of $Pr_{0.7}Ca_{0.3}MnO_3$.

4. The memory array of claim 1 wherein said second connection line includes an electrode material taken from the group of electrode materials consisting of Al, Cu, Pt, Ir and Au.

5. The memory array of claim 1, the insulating layer includes plural, spaced-apart nano-scale trenches, and wherein a n+ layer is located under each nano-scale trench and wherein each nano-scale trench has a p+ layer formed therein wherein n+ ions are diffused to occupy between about 20% to 30% of the space between the spaced-apart nano-scale trenches.

6. A cross-point memory array comprising:

a silicon substrate, including wells formed therein with threshold voltage adjustment therein;

a gate, a source and a drain formed as an active area on the substrate;

an insulating layer formed over portions of the substrate and active area;

a pair of spaced-apart, nano-scale trenches formed in the insulating layer;

an epitaxial silicon layer formed in each nano-scale trench;

a first connection line formed on the epitaxial silicon layer;

a colossal magnetoresistive layer formed on the first connection line;

a silicon nitride layer formed on a portion of the colossal magnetoresistive layer; and a second connection line formed adjacent the silicon nitride layer and on the colossal magnetoresistive.

7. The memory array of claim 6 wherein said first connection line is formed from an electrode material taken from the group of electrode materials consisting of $Y_xBa_2Cu_3O_{7-x}$, Pt and Ir.

8. The memory array of claim 6 wherein said colossal magnetoresistive layer is formed of $Pr_{0.7}Ca_{0.3}MnO_3$.

9. The memory array of claim 6 wherein said second connection line includes an electrode material taken from the group of electrode materials consisting of Al, Cu, Pt, Ir and Au.

10. The memory array of claim 6 which includes plural, spaced-apart nano-scale trenches, and wherein a n+ layer is located under each nano-scale trench, and wherein trench nano-scale trench has a p+ layer formed therein; wherein n+ ions are diffused to occupy between about 20% to 30% of the space between the spaced-apart, nano-scale trenches.

11. A cross-point memory array having a nano-scale trench formed therein, comprising:

a silicon substrate, including wells formed therein with threshold voltage adjustment therein;

a gate, a source and a drain formed as an active area on the substrate;

an insulating layer formed over portions of the substrate and active area;

a pair of spaced-apart nano-scale trenches formed in the insulating layer;

a first connection line formed on in each nano-scale trench;

a colossal magnetoresistive layer formed on the first connection line;

a silicon nitride layer formed on a portion of the colossal magnetoresistive layer;

a second connection line formed adjacent the silicon nitride layer and on the colossal magnetoresistive layer;

wherein an n+ layer is located under each nano-scale trench, and wherein each nano-scale trench has a p+ layer formed therein; wherein n+ ions are diffused to occupy between about 20% to 30% of the space between the spaced-apart, nano-scale trenches.

12. The memory array of claim 11 wherein said first connection line is formed from an electrode material taken from the group of electrode materials consisting of $Y_xBa_2Cu_3O_{7-x}$, Pt and Ir.

13. The memory array of claim 11 wherein said colossal magnetoresistive layer is formed of $Pr_{0.7}Ca_{0.3}MnO_3$.

14. The memory array of claim 11 wherein said second connection line includes an electrode material taken from the group of electrode materials consisting of Al, Cu, Pt, Ir and Au.

15. The memory array of claim 11 which includes a silicon epitaxial layer having a thickness of between about 100 nm to 300 nm formed on the silicon substrate in each nano-scale trench.

* * * * *